US009337856B1

(12) United States Patent
Dhawan et al.

(10) Patent No.: US 9,337,856 B1
(45) Date of Patent: May 10, 2016

(54) CALIBRATION FOR A SINGLE RAMP MULTI SLOPE ANALOG-TO-DIGITAL CONVERTER

(71) Applicants: Nishant Dhawan, Santa Barbara, CA (US); Kenton Veeder, Santa Barbara, CA (US)

(72) Inventors: Nishant Dhawan, Santa Barbara, CA (US); Kenton Veeder, Santa Barbara, CA (US)

(73) Assignee: Senseeker Engineering Inc., Goleta, CA (US)

( * ) Notice: Subject to any disclaimer, the term of this patent is extended or adjusted under 35 U.S.C. 154(b) by 0 days.

(21) Appl. No.: 14/867,201

(22) Filed: Sep. 28, 2015

(51) Int. Cl.
*H03M 1/10* (2006.01)
*H03M 1/06* (2006.01)
*H03M 1/56* (2006.01)

(52) U.S. Cl.
CPC .......... *H03M 1/1009* (2013.01); *H03M 1/0697* (2013.01); *H03M 1/56* (2013.01); *H03M 2201/2355* (2013.01)

(58) Field of Classification Search
CPC ............... H03M 1/56; H03M 1/1009; H03M 2201/2355; H03M 1/0697
USPC .......................................... 341/120, 167, 155
See application file for complete search history.

(56) References Cited

U.S. PATENT DOCUMENTS

| | | | | | |
|---|---|---|---|---|---|
| 4,559,521 | A | * | 12/1985 | Yada | ........................ H03M 1/00 324/99 D |
| 4,857,933 | A | * | 8/1989 | Knight | .................... H03M 1/00 341/128 |
| 6,906,648 | B1 | * | 6/2005 | Koike | .................. H03M 1/0697 341/118 |
| 7,064,694 | B1 | * | 6/2006 | Male | .................... H03M 1/162 341/129 |

\* cited by examiner

*Primary Examiner* — Brian Young
(74) *Attorney, Agent, or Firm* — Mark Rodgers

(57) ABSTRACT

Methods and Systems for calibrating a Single Ramp Multiple Slope Analog to Digital Converter (SRMS ADC), the ADC including a counter and a plurality N of charge and discharge elements of different time constant i.e. slope, wherein the relationships between slopes is defined as a function of the shallowest slope $S_N$ such that $S_1=K_1 \cdot S_N$, $S_2=K_2 \cdot S_N$, ... $S_{N-1}=K_{N-1} \cdot S_{N-1}$ where the K values are integers, and the code count for conversion is $C=K_1 \cdot C_1+K_2 \cdot C_2+ \ldots K_{N-1} \cdot C_{N-1}+C_N$ where each $C_i$ represents an observed counts per each slope for a conversion, including; sampling for a first calibration pass a voltage with the ADC, discharging the voltage on the steepest slope for a number of counter counts $C_{11}$, charging and discharging on the remaining slopes up to $K_2$ to $K_{N-1}$ for a number of counts per slope, $C_{i1}$ e.g. $C_{21}$ to $C_{N-1,1}$, discharging the remaining voltage residue on the shallowest slope and note the count, $C_{N,1}$, sampling the same voltage on the ADC for a second calibration pass, discharging the voltage on the steepest slope for a modified number of counter counts $C_{12}=C_{11}+/-X$, modifying the number of charge/discharge counts time $C_{i2}$ for the slopes $K_2$ to $K_{N-1}$ to adjust for the change expected from the modified steep slope discharge to reach the shallowest slope with the same expected residue as for the first calibration pass, discharging the remaining voltage residue on the shallowest slope and note the actual count, $C_{N,2}$, adjusting $K_1$ to $K_{1a}$ based on the difference between $C_{N,1}$ and $C_{N,2}$, and; using $C=K_{1a} \cdot C_1+K_2 \cdot C_2+ \ldots K_{N-1} \cdot C_{N-1}+C_N$ as the count code for conversion.

20 Claims, 3 Drawing Sheets

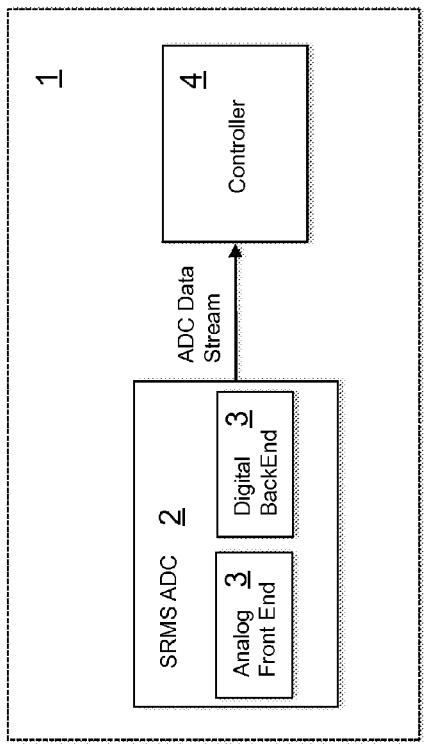
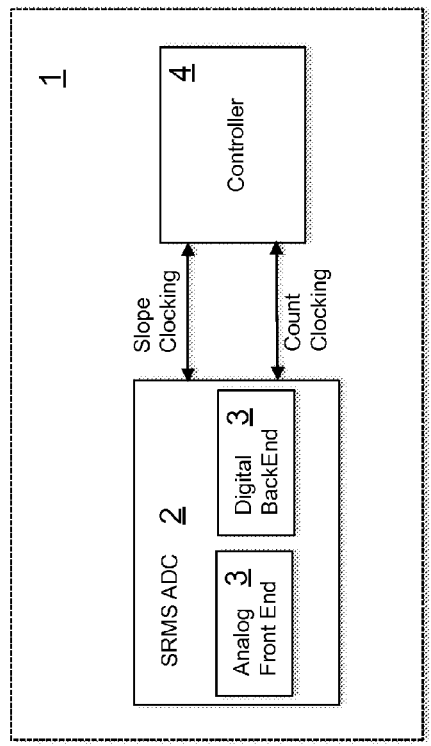
Figure 3a
Figure 3b

CALIBRATION FOR A SINGLE RAMP MULTI SLOPE ANALOG-TO-DIGITAL CONVERTER

The specification relates to Slope/Ramp Analog to Digital Converter's (ADC's) and in particular to calibration of a Single Ramp Multiple Slope (SRMS) ADC.

SRMS ADC's are applicable to application such as imaging sensors where conversion speeds are moderate, conversion accuracies are important and integrated circuit implementation need be efficient. SRMS ADC's are described in "Speed Improvements for Dual-Slope A/D Converters" by Saleem M. R. Taha, IEEE TRANSACTIONS ON INSTRUMENTATION AND MEASUREMENT, IM-34, NO. 4, DECEMBER 1985, incorporated by reference in its entirety. SRMS ADC's are inherently accurate but improvements in performance may be desirable.

BRIEF DESCRIPTION

In some embodiments, a method or systems may be provided for an SRMS ADC calibration where calibration takes place in two passes of sampling the same voltage. In the first pass the voltage is charged and discharged for predetermined numbers of counts of the various ADC slopes until the shallowest slope is reached and the counts to discharge the residual voltage is stored. On a second pass, the number of counts for the steepest slope is changed and the number of counts for the next steepest to next shallowest slopes are adjusted to values such that the same residue should remain when the shallowest slope is reached. The actual residue is discharged and the number of counts to discharge the residue on the two passes is compared. The difference between the two is used to adjust the scaling factor for the steepest slope for actual conversion.

In some embodiments, a method may be provided for calibrating a Single Ramp Multiple Slope Analog to Digital Converter (SRMS ADC), the ADC including a counter and a plurality N of charge and discharge elements of different time constant i.e. slope, wherein the relationships between slopes may be defined as a function of the shallowest slope $S_N$ such that $S_1 = K_1 \cdot S_N$, $S_2 = K_2 \cdot S_N$, ... $S_{N-1} = K_{N-1} \cdot S_{N-1}$ where the K values are integers, and the code count for conversion may be $C = K_1 \cdot C_1 + K_2 \cdot C_2 + \ldots K_{N-1} \cdot C_{N-1} + C_N$ where each $C_i$ may represent an observed count per each slope for a conversion, comprising; sampling for a first calibration pass a voltage with the ADC, discharging the voltage on the steepest slope for a number of counter counts $C_{11}$, charging and discharging on the remaining slopes up to $K_2$ to $K_{N-1}$ for a number of counts per slope, $C_{i1}$ i.e. $C_{21}$ to $C_{N-1,1}$, discharging the remaining voltage residue on the shallowest slope and note the count, $C_{N,1}$, sampling the same voltage on the ADC for a second calibration pass, discharging the voltage on the steepest slope for a modified number of counter counts $C_{12} = C_{11} +/- X$, modifying the number of charge/discharge counts time $C_{i2}$ for the slopes $K_2$ to $K_{N-1}$ to adjust for the change expected from the modified steep slope discharge to reach the shallowest slope with the same expected residue as for the first calibration pass, discharging the remaining voltage residue on the shallowest slope and note the actual count, $C_{N,2}$, adjusting $K_1$ to $K_{1a}$ based on the difference between $C_{N,1}$ and $C_{N,2}$, and; using $C = K_{1a} \cdot C_1 + K_2 \cdot C_2 + \ldots K_{N-1} \cdot C_{N-1} + C_N$ as the count code for conversion.

In some embodiments a Single Ramp Multiple Slope Analog to Digital Converter (SRMS ADC) system may be provided, the ADC including a counter and a plurality N of charge and discharge elements of different time constant e.g. slope, wherein the relationships between slopes may be defined as a function of the shallowest slope $S_N$ such that $S_1 = K_1 \cdot S_N$, $S_2 = K_2 \cdot S_N$, ... $S_{N-1} = K_{N-1} \cdot S_{N-1}$ where the K values are integers, and the code count for conversion may be $C = K_1 \cdot C_1 + K_2 \cdot C_2 + \ldots K_{N-1} \cdot C_{N-1} + C_N$ where each $C_i$ may represent an observed count per each slope for a conversion, the system configured to; sample for a first calibration pass a voltage with the ADC, discharge the voltage on the steepest slope for a number of counter counts $C_{11}$, charge and discharging on the remaining slopes up to $K_2$ to $K_{N-1}$ for a number of counts per slope, $C_{i1}$ e.g. $C_{21}$ to $C_{N-1,1}$, discharge the remaining voltage residue on the shallowest slope and note the count, $C_{N,1}$, sample the same voltage on the ADC for a second calibration pass, discharge the voltage on the steepest slope for a modified number of counter counts $C_{12} = C_{11} +/- X$, modify the number of charge/discharge counts time $C_{i2}$ for the slopes $K_2$ to $K_{N-1}$ to adjust for the change expected from the modified steep slope discharge to reach the shallowest slope with the same expected residue as for the first calibration pass, discharge the remaining voltage residue on the shallowest slope and note the actual count, $C_{N,2}$, adjust $K_1$ to $K_{1a}$ based on the difference between $C_{N,1}$ and $C_{N,2}$, and; use $C = K_{1a} \cdot C_1 + K_2 \cdot C_2 + \ldots K_{N-1} \cdot C_{N-1} + C_N$ as the count code for conversion.

In some embodiments, $K_1 \cdot X = \Sigma K_i \cdot \Delta_i$ from i=2 to N−1, where $C_{i1} + \Delta_i = C_{i2}$.

In some embodiments, X=N−2, and the modified second pass clock counts $C_{i2} = C_{i1} + K_1/K_i$ for each i from 2 to N−1.

In some embodiments the relationship between K values is powers of 2.

In some embodiments, N=3, $K_1$ is 512, and $K_2$ is 16.

In some embodiments, $C_{11}$ is 512, $C_{12}$ is 32, $C_{12}$ is 513 and $C_{22}$ is 64.

In some embodiments, the calibration may be performed by back-end digital logic integrated with the ADC circuitry.

In some embodiments, count and slope switch information is provided by the ADC to a controller or provided by a controller to the ADC, and the calibration is performed by at least one signal processing logic element or programs executing on the controller.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure.

FIG. 3a shows a block diagram of a configuration where the calibration is performed in the digital backend of the ADC and FIG. 3b where the calibration is performed all or in part by a controller interfaced to the ADC, according to illustrative embodiments

DETAILED DESCRIPTION OF ILLUSTRATIVE EMBODIMENTS

Figure 1A:
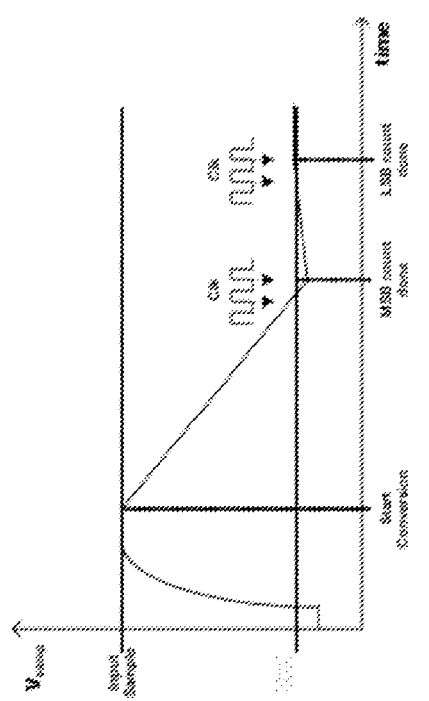
FIG. 1a illustrates general operation of slope/ramp ADC's.

One or more embodiments described herein may provide a digital calibration constant which may be a measure of mismatch between the multiple analog slopes of an SRMS ADC.

One or more embodiments described herein may provide for applying the calibration constant during conversion which may remove part of the effect of the mismatch between the slopes which may be a source of non-linearity in such ADCs.

One or more embodiments described herein may provide for a calibration constant for ADCs to be stored in local memory in a digital calibration engine implemented in a digital backend of an SRMS ADC.

One or more embodiments described herein may provide a calibration constant which may be captured and stored in an external processor for post-processing of un-calibrated ADC output data.

The SRMS calibration system and methods may be any combination of computer programs or a digital logic elements and implemented using any of a variety of analog and/or digital discrete circuit components (transistors, resistors, capacitors, inductors, diodes, etc.), programmable logic, microprocessors, microcontrollers, application-specific integrated circuits, or other circuit elements. A non-transient memory configured to store executable computer programs may be implemented along with discrete circuit components to carry out one or more of the processes described herein. The SRMS ADC system may include one or more analog front ends including sampling, integrating, charging, discharging, comparing, gain, switching elements and others and one or more digital backend elements including counting, data encoding, various digital logic functions, sequencing, clocking and others. The SRMS ADC may interface with one or more external controllers which may be computers, local microcontrollers, digital logic controllers, Personal Electronic Devices (PC, tablet, smartphone etc.) or any other computing higher level logic devices.

A calibration technique for analog-to-digital converters and in particular to single ramp multiple slope architectures is described. Embodiments may relate to calibration of a single ADC or multiple ADCs in an array for multiple channels of conversion. One application of these ADCs include image sensors where a large number of column parallel ADCs are employed to perform conversion of large arrays. Such ADC's are described in the Taha reference as well as other available references. These ADC's are accurate, and implement efficiently in terms of integrated circuits, making them suitable for applications such as readout circuits for imaging arrays where conversion speeds are moderate. A short review is provided herein.

The predecessor to the SRMS ADC is the single ramp single slope (SRSS). The term single ramp means that the reference voltage ramp single makes only a single pass over the full reference voltage ramp range. The term single slope means that the reference voltage ramp signal has a single constant slope across the full reference voltage ramp range.

In the single ramp single slope architecture, the unknown analog voltage signal to be converted is compared to the ramp voltage as it sweeps across the full reference voltage range. The time it takes for the ramp voltage to reach the unknown signal voltage and trip a comparator is proportional to the signal voltage itself. The time is measured using a digital counter clocked with a known frequency. The major drawback of the single ramp single slope architecture is the number of clock cycles required for conversion. $2^M$ clock cycles are required to achieve M bit resolution.

The single ramp multi slope architecture improves on the single ramp single slope architecture by using multiple slopes to perform conversion. The operation of this kind of ADC can be thought of as a type of successive approximation algorithm. FIG. 1a illustrates just two slopes for clarity. Most significant bits (MSB) are counted while the unknown input sample is being discharged using the steep slope. Once the discharging voltage reaches the reference voltage the shallow slope is used to charge the sample node back up to the reference voltage while counting the least significant bits (LSB). The final output code is equal to the MSB count times the scaling factor of the two slopes minus the LSB count.

Figure 1B:
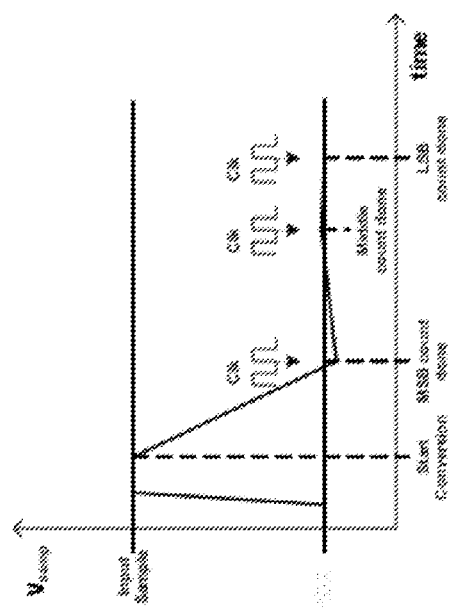
FIG. 1b illustrates an SRMS ADC, with three slopes.

Now consider the single ramp multi slope architecture with three slopes as shown in FIG. 1b. This architecture reduces the conversion time by using an additional slope with magnitude between the steepest MSB counting slope and shallowest LSB counting slope. This single ramp multi slope (SRMS) analog-to-digital (ADC) converter with three slopes is capable of achieving resolution up to 14-15 bits at reasonable conversion rates for application such as imaging arrays.

Mismatch between ADC ramp current sources and sinks used to create the multiple slopes for the ramp may be a significant contributor to SRMS ADC non-linearity.

The single ramp multi slope architecture may use a digital backend engine working alone or with an external controller to count clock cycles during the different slope intervals of conversion. The count of clock cycles in each stage is then multiplied by a scaling factor that captures the ratios of the slopes.

The ADC conversion is proportional to a count code, C, which in turn is equal to:

$$C = K_1 \cdot C_1 + K_2 \cdot C_2 + \ldots K_{N-1} C_{N-1} + C_N$$

Where $C_i$ are the observed counts counted in each slope and $K_i$ are the scaling factor equals to the slope differences. With $S_1$ the steepest slope and $S_N$ the shallowest slope, $K_1 \cdot S_N = S_1$, $K_2 \cdot S_N = S_2$ and so on. For N slopes, there are N−1 scaling factors. Thus the steepest slope counts are given more weight than the shallower slopes. This allows the conversion to be done with fewer total counts as the steeper slope counts are multiplied by the scaling factors, allowing the total count to reach the desired conversion count more quickly.

For instance if N=4, and the steepest slope is 1000 times the shallowest, next steepest 100 times, next steepest 10 times, the code would be:

$$C = 1000 \cdot C_1 + 100 \cdot C_2 + 10 \cdot C_3 + C_4$$

For powers of 2 if N=4, and the steepest slope is 8 times the shallowest, next steepest 4 times, next steepest 2 times, the code would be:

$$C = 8 \cdot C_1 + 4 \cdot C_2 + 2 \cdot C_3 + C_4$$

Thus the steepest slope count can be considered the MSB and the shallow slope count the LSB with the intermediate counts in between. N=3 is a common SRMS configuration, but, N=2, 4 or any number within reason is possible. It should be noted that the slopes may not all be of the same direction, and thus the K values may be positive or negative numbers, typically integers, but integers are not strictly required. However since both processor and logic implementations work best in specific numbering systems, many actual SRMS scaling factors are integer powers of 2.

The scaling factors, $K_i$, can thus be thought of as ideal digital constants that capture the scaling of the slopes and consequently the counted clock cycles in each slope interval of discharge/charge of the input signal. Due to process variations of the analog circuits, the actual slope scaling factors will not be exactly equal to the designed ideal values. The embodiments of the calibration methods and system aim to correct for this mismatch in analog circuit behavior by capturing the mismatch as a digital constant different than the ideal constant for the steepest slope scaling factor. The presented embodiment of the calibration method will result in a constant, $K_{1a}$ which is different that the ideal constant $K_1$. $K_{1a}$ captures all or part of the mismatch in slopes for slopes $S_1$ to $S_{N-1}$ with respect to slope $S_N$ as a single constant.

Figure 2:
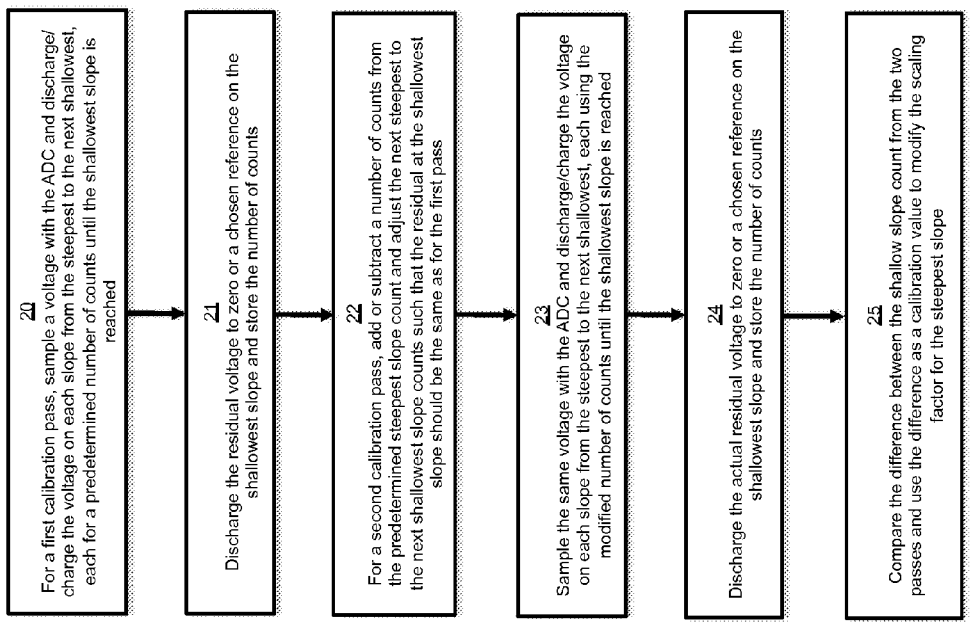
FIG. 2 is a flow chart of a calibration method according to an illustrative embodiment.

An embodiment of a calibration method is shown in FIG. 2. The method assumes that the ideal K values expected from the design of the ADC are first loaded into the calibration logic and/or program. The method is a two pass calibration in this embodiment. On the first pass in step 20, sample a voltage with the ADC and then charge/discharge the voltage starting with the steepest slope for a predetermined number of counts, then switch to the second steepest slope for a second predetermined number of counts and continue until the shallowest slope is reached. For N total slopes, the predetermined counts per slope will be represented as $C_{i1}$ where i goes from 1 to N−1

In step 21, on the shallowest slope, discharge any residual voltage to zero or a predetermined reference and note the number of counts required to discharge the residual voltage. Residual count for the first pass will be denoted as $C_{N,1}$.

In step 22 add or subtract counts to the predetermined steepest slope count. The new slope 1 count will be denoted as $C_{12}=C_{11}+/-X$. Adjust the next steepest to the next shallowest predetermined slope counts such that difference in charging/discharging on the steepest slope compared to the first pass is exactly balanced by the amount of time spent charging/discharging on the other slopes on a second calibration pass. These adjusted second pass counts will be denoted as $C_{i2}=C_{i1}+\Delta_i$ where $\Delta_i$ is the adjustment made to each slope count In step 23 sample the same voltage on the ADC and go through the charge/discharge per slope using the adjusted slope counts until the shallowest slope is reached. In theory the residue should be the same as on the first pass.

In step 24 discharge the actual residue on the shallowest slope as in step 21 and note the actual residue count, denoted as $C_{N,2}$.

Compare the difference $(C_{N,1}-C_{N,2})$ between the two shallow slope counts. This represents the non-linearity among the slopes, since by changing count times on the other slopes between the two passes, effectively the second pass is on a different point on the time constants of the slope circuitry than the first pass. Use this difference to modify the steep slope scaling factor ($K_1$) to a calibrated scaling factor ($K_{1a}$).

The general calibration method is a two pass method and makes an adjustment to the time spent at every slope between the two passes, thus capturing all of the mismatches in one summary number. It is possible to perform multiple passes and cross check the slope differences, but this would not be as efficient. It is also possible to repeat the method by adding counts to the second slope $S_2$ and then adjusting the counts of $S_3$ to $S_{N-1}$ to derive and adjusted second slope scaling factor $K_{2a}$. This could be repeated for all of the scaling factors above $K_{N-1}$ if desired.

The general calibration method allows for any adjustment made to any of the slope times as long as they balance in terms of weighted effect. Basically as long as the following relationship holds the second pass should balance the first:

$$K_1 \cdot X = \Sigma K_i \Delta_i \text{ from } i=2 \text{ to } N-1$$

In practice, it is more efficient computationally to perform the adjustment in a more controlled manner. For instance if N−2 clock samples is added to the slope 1 first pass count, ie X=N−2, than each of the second pass slope counts for slopes 2 to N−1 can compensate for one of the added steep slope counts and the adjustment is straight forward:

$$C_{i2}=C_{i1}+K_1/K_i \text{ for each } i \text{ from } 2 \text{ to } N-1, \text{ essentially}$$
$$\Delta_i=K_1/K_i.$$

Although the case for any number of slopes and any relation between the slopes has been presented, computationally it may be convenient to use smaller numbers, say N less that 5 and well defined relationships between the scaling factors such as powers of 2. Following is a specific example.

The calibration works for any reasonable values of count and slopes as long as the voltage stays within range of the ADC internal circuitry.

In the specific case the ideal design constants are $K_1=2^9=512$ and $K_2=2^4=16$. To reiterate, ideally 512 LSB clocks are equivalent to 1 clock cycle of the MSB slope discharge. 16 LSB clocks are equivalent to 1 clock cycle of middle slope charge up. Also, $K_1/K_2=32$ counts of the middle slope equate to 1 count of the MSB slope.

At the start of the calibration routine, the ideal constant of 512 is set in the digital logic and/or program. A DC voltage signal is sampled at the input of the ADC. The calibration algorithm is performed with a two-pass operation.

In the first step, the sampled voltage is discharged with a fixed number of clock cycles using the first steepest slope, say $C_{11}=15$ clock cycles using the steep slope. The voltage is then charged for $C_{21}=32$ clock cycles using the middle slope. The residue from the first two stages is then discharged using the shallowest slope and the shallow slope count is incremented per clock cycle until the voltage reaches the reference voltage and a comparator (See Taha reference) trips signaling the ADC to stop counting. This yields to a certain count, $C_{3,1}$ in the working memory of the digital backend and/or controller.

In the second step of calibration, the same DC voltage signal as the first pass is again sampled at the input of the ADC. This time, the sampled voltage is discharged by one additional clock cycle as in the first step, say $C_{12}=C_{11}+1=16$ clock cycles. The voltage is then charged with $C_{22}=C_{21}+32=64$ clock cycles using the middle slope. Finally, the residue from the first two stages is discharged using the shallowest slope and the count in the digital engine is decremented per clock cycle until the voltage reaches the reference voltage and the comparator trips signaling the ADC to stop counting at a count $C_{3,2}$.

The residue left over to discharge with the least steep slope is a measure of the matching between the three slopes. If the slopes were matched to the ideal relationships, the residue remaining after discharging for $C_{11}$ clock cycles with the steepest slope and then charging for $C_{21}$ clock cycles with middle slope, should match with the residue remaining after discharging for $C_{11}+1$ clock cycles with the steepest slope and then charging for $C_{21}+32$ clock cycles with middle slope, since 32 counts of the middle slope equate to 1 count of the MSB slope.

As a result of the above procedure, we are left with a digital difference of the mismatch between the slopes, which we call the stage 1 calibration constant, $K_{1a}$.

The residue to be discharged using the smallest current in both steps of calibration should be ideally equal resulting in $K_{1a}=K_1$. Any difference between the analog voltage residues between the two steps is caused due to mismatches between the three slopes. The calibration method quantizes this difference and adds or subtracts from the ideal constant $K_1$ resulting in the calibration constant, $K_{1a}$, which can then be used as the multiplier for each MS clock count. After calibration has been performed the digital output of the ADC will be calculated by the digital backend to be:

$$C=K_{1a} \cdot C_1 + K_2 \cdot C_2 + C_3$$ where $C_1$, $C_2$ and $C_3$ are the counts for steep slope 1, middle slope 2 and shallow slope 3 respectively during normal conversion cycle.

To illustrate calibration, consider a 3.9% mismatch in slope 1 with respect to slope 3. As a result the ratio of the slopes of slope 1 to slope 3 is equal to 514 instead of 512. The calibration routine will start with a constant $K_1$ of 512 and after completing the two steps the difference between ideal and real will be added to this starting constant and result in a calibration constant of $K_{1a}$=514. This calibration constant can subsequently be used to convert analog samples with the correct scaling factor of MSB counts to generate the digital output code.

The calibration method is versatile because each ADC can use its own digital backend to calculate a calibration constant. This is very useful in applications requiring large arrays of ADCs, for instance, in a column parallel ADC architecture for image sensors.

The two-step calibration method can be repeated multiple times to reduce the temporal noise captured by the distinct input voltage samples at the start of each step. The starting digital constant in the backend must be multiplied by the number of times the routine is performed and the result in the digital backend at the end must be divided to obtain the final calibration constant. For instance, using our earlier example with $K_1$=512 and $K_2$=16, if we are to repeat the routine twice, the starting constant in the digital backend must be set to $K_1 \cdot 2$=1024. And the final result after performing the two-step routine twice must be divided by 2 to obtain the calibration constant.

Referring to FIGS. 3a and b, the ADC system 1 may be implements in several configurations. In FIG. 1a, the SRMS ADC 2 has an analog front end 2, and digital back end 4. It communicates with an external processor or controller logic 5. In this configuration the digital backend contains sufficient logic to perform the conversion and delivering converted, calibrated data to the external world.

In FIG. 3b, the ADC shares clocking data with an external controller, either providing the clocking for counting and switching or receiving the clocking. In this configuration more of the operation is borne by external processing.

The embodiments described herein are exemplary. Modifications, rearrangements, substitute processes, etc. may be made to these embodiments and still be encompassed within the teachings set forth herein. One or more of the steps, processes, or methods described herein may be carried out by one or more processing and/or digital devices, suitably programmed.

Depending on the embodiment, certain acts, events, or functions of any of the methods described herein can be performed in a different sequence, can be added, merged, or left out altogether (e.g., not all described acts or events are necessary for the practice of the algorithm). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a processor configured with specific instructions, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor and/or digital engine can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. For example, the digital backend described herein may be implemented using a discrete memory chip, a portion of memory in a microprocessor, flash, EPROM, or other types of memory. Alternatively, the entire system could be designed to be monolithic.

The elements of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. A software module can comprise computer-executable instructions which cause a hardware processor to execute the computer-executable instructions.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y or Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a result (e.g., measurement value) is close to a targeted value, where close can mean, for example, the result is within 80% of the value, within 90% of the value, within 95% of the value, or within 99% of the value.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the devices or methods illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

The invention claimed is:

1. A method for calibrating a Single Ramp Multiple Slope Analog to Digital Converter (SRMS ADC), the ADC including a counter and a plurality N of charge and discharge elements of different time constant i.e. slope, wherein the relationships between slopes is defined as a function of the shallowest slope $S_N$ such that $S_1=K_1 \cdot S_N$, $S_2=K_2 \cdot S_N$, ... $S_{N-1}=K_{N-1} \cdot S_{N-1}$ where the K values are integers, and the code count for conversion is $C=K_1 \cdot C_1 + K_2 \cdot C_2 + \ldots K_{N-1} \cdot C_{N-1} + C_N$ where each $C_i$ represents an observed count per each slope for a conversion, comprising;
 a. sampling for a first calibration pass a voltage with the ADC,
 b. discharging the voltage on the steepest slope for a number of counter counts $C_{11}$,
 c. charging and discharging on the remaining slopes up to $K_2$ to $K_{N-1}$ for a number of counts per slope, $C_{i1}$ e.g. $C_{21}$ to $C_{N-1,1}$,
 d. discharging the remaining voltage residue on the shallowest slope and note the count, $C_{N,1}$,
 e. sampling the same voltage on the ADC for a second calibration pass,
 f. discharging the voltage on the steepest slope for a modified number of counter counts $C_{12}=C_{11}+/-X$,
 g. modifying the number of charge/discharge counts time $C_{i2}$ for the slopes $K_2$ to $K_{N-1}$ to adjust for the change expected from the modified steep slope discharge to reach the shallowest slope with the same expected residue as for the first calibration pass,
 h. discharging the remaining voltage residue on the shallowest slope and note the actual count, $C_{N,2}$,
 i. adjusting $K_1$ to $K_{1a}$ based on the difference between $C_{N,1}$ and $C_{N,2}$, and;
 j. using $C=K_{1a} \cdot C_1 + K_2 \cdot C_2 + \ldots K_{N-1} \cdot C_{N-1} + C_N$ as the count code for conversion.

2. The method of claim 1 wherein $K_1 \cdot X = \Sigma K_i \cdot \Delta_i$ from i=2 to N−1, where $C_{i1} + \Delta_i = C_{i2}$.

3. The method of claim 1 wherein X=N−2, and the modified second pass clock counts $C_{i2}=C_{i1}+K_1/K_i$ for each i from 2 to N−1.

4. The method of claim 1 where the relationship between K values is powers of 2.

5. The method of claim 2 where the relationship between K values is powers of 2.

6. The method of claim 4 wherein N=3, $K_1$ is 512, and $K_2$ is 16.

7. The method of claim 5 wherein $C_{11}$ is 512, $C_{12}$ is 32, $C_{12}$ is 513 and $C_{22}$ is 64.

8. The method of claim 1 wherein the calibration is performed by back-end digital logic integrated with the ADC circuitry.

9. The method of claim 1 wherein count and slope switch information is at least one of provided by the ADC to a controller or provided by a controller to the ADC and the calibration is performed by at least one signal processing logic element or programs executing on the controller.

10. A Single Ramp Multiple Slope Analog to Digital Converter (SRMS ADC) system, the ADC including a counter and a plurality N of charge and discharge elements of different time constant e.g. slope, wherein the relationships between slopes is defined as a function of the shallowest slope $S_N$ such that $S_1=K_1 \cdot S_N$, $S_2=K_2 \cdot S_N$, ... $S_{N-1}=K_{N-1} \cdot S_{N-1}$ where the K values are integers, and the code count for conversion is $C=K_1 \cdot C_1 + K_2 \cdot C_2 + \ldots K_{N-1} \cdot C_{N-1} + C_N$ where each $C_i$ represents an observed count per each slope for a conversion, the system configured to;
 a. sample for a first calibration pass a voltage with the ADC,
 b. discharge the voltage on the steepest slope for a number of counter counts $C_{11}$,
 c. charge and discharging on the remaining slopes up to $K_2$ to $K_{N-1}$ for a number of counts per slope, $C_{i1}$ e.g. $C_{21}$ to $C_{N-1,1}$,
 d. discharge the remaining voltage residue on the shallowest slope and note the count, $C_{N,1}$,
 e. sample the same voltage on the ADC for a second calibration pass,
 f. discharge the voltage on the steepest slope for a modified number of counter counts $C_{12}=C_{11}+/-X$,
 g. modify the number of charge/discharge counts time $C_{i2}$ for the slopes $K_2$ to $K_{N-1}$ to adjust for the change expected from the modified steep slope discharge to reach the shallowest slope with the same expected residue as for the first calibration pass,
 h. discharge the remaining voltage residue on the shallowest slope and note the actual count, $C_{N,2}$,
 i. adjust $K_1$ to $K_{1a}$ based on the difference between $C_{N,1}$ and $C_{N,2}$, and;
 j. use $C=K_{1a} \cdot C_1 + K_2 \cdot C_2 + \ldots K_{N-1} \cdot C_{N-1} + C_N$ as the count code for conversion.

11. The system of claim 10 wherein $K_1 \cdot X = \Sigma K_i \cdot \Delta_i$ from i=2 to N−1, where $C_{i1} + \Delta_i = C_{i2}$.

12. The system of claim 10 wherein X=N−2, and the modified second pass clock counts $C_{i2}=C_{i1}+K_1/K_i$ for each i from 2 to N−1.

13. The system of claim 10 where the relationship between K values is powers of 2.

14. The system of claim 12 where the relationship between K values is powers of 2.

15. The system of claim of claim 14 wherein N=3, $K_1$ is 512, and $K_2$ is 16.

16. The system of claim 15 wherein $C_{11}$ is 512, $C_{12}$ is 32, $C_{12}$ is 513 and $C_{22}$ is 64.

17. The system of claim 10 wherein the calibration is performed by back-end digital logic integrated with the ADC circuitry.

18. The system of claim 10 wherein count and slope switch information is at least one of provided by the ADC to a controller or provided a controller to the ADC, and the calibration is performed by at least one signal processing logic element or programs executing on the controller.

19. The method of claim 1 wherein at least one adjusted scaling factors $K_{2a}$ through $K_{N-2}$ are derived by repeating the calibration at least once starting with the second slope through the N−2 slope.

20. The system of claim 10 wherein at least one adjusted scaling factors $K_{2a}$ through $K_{N-2}$ are derived by repeating the calibration at least once starting with the second slope through the N−2 slope.

* * * * *